United States Patent
Wang

(10) Patent No.: US 12,368,458 B2
(45) Date of Patent: *Jul. 22, 2025

(54) MULTISTAGE DOHERTY POWER AMPLIFIER AND TRANSMITTER

(71) Applicant: Telefonaktiebolaget LM Ericsson (publ), Stockholm (SE)

(72) Inventor: Zhancang Wang, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 803 days.

This patent is subject to a terminal disclaimer.

(21) Appl. No.: 17/588,524

(22) Filed: Jan. 31, 2022

(65) Prior Publication Data

US 2022/0158670 A1 May 19, 2022

Related U.S. Application Data

(63) Continuation of application No. 16/617,204, filed as application No. PCT/CN2017/093777 on Jul. 21, 2017, now Pat. No. 11,239,869.

(51) Int. Cl.
*H04B 1/04* (2006.01)
*H03F 1/02* (2006.01)
(Continued)

(52) U.S. Cl.
CPC ......... *H04B 1/0475* (2013.01); *H03F 1/0288* (2013.01); *H03F 3/211* (2013.01);
(Continued)

(58) Field of Classification Search
None
See application file for complete search history.

(56) References Cited

U.S. PATENT DOCUMENTS

| 6,472,934 B1 | 10/2002 | Pehlke |
| 6,853,245 B2 | 2/2005 | Kim et al. |

(Continued)

FOREIGN PATENT DOCUMENTS

| CN | 101783652 A | 7/2010 |
| CN | 102355198 B | 11/2013 |

(Continued)

OTHER PUBLICATIONS

Examination Report No. 1 for Australian Patent Application No. 2021203810, mailed Jul. 22, 2022, 4 pages.

(Continued)

*Primary Examiner* — Pablo N Tran
(74) *Attorney, Agent, or Firm* — Withrow & Terranova, PLLC

(57) ABSTRACT

A multistage Doherty power amplifier and a transmitter are provided, and the multistage Doherty power amplifier includes: a generalized carrier amplifier, which is a nested 2-way inverted Doherty sub amplifier, and a generalized peaking amplifier, connected to the generalized carrier amplifier, which is a nested single ended sub amplifier or a nested 2-way normal Doherty sub amplifier, the generalized carrier amplifier and the generalized peaking amplifier are arranged in a generalized 2-way inverted Doherty power amplifier form. With the multistage Doherty power amplifier, signal power probability distribution function (PDF) oriented for a cost-effective multi stage Doherty PA design is applied, and 2-way normal and inverted Doherty PA cells are used as basic units to construct multistage Doherty PA with gain extension effect.

20 Claims, 10 Drawing Sheets

(51) Int. Cl.
*H03F 3/19* (2006.01)
*H03F 3/21* (2006.01)
*H03F 3/68* (2006.01)
*H04L 27/26* (2006.01)
*H04W 84/04* (2009.01)

(52) U.S. Cl.
CPC .................. *H03F 2200/451* (2013.01); *H04B 2001/0408* (2013.01); *H04L 27/2614* (2013.01); *H04W 84/042* (2013.01)

(56) References Cited

U.S. PATENT DOCUMENTS

| | | | |
|---|---|---|---|
| 7,629,844 | B2 | 12/2009 | Elmala |
| 7,663,435 | B2 | 2/2010 | Kim et al. |
| 8,305,141 | B2 | 11/2012 | Jeong et al. |
| 8,576,010 | B2 | 11/2013 | Yanduru et al. |
| 8,754,709 | B2 | 6/2014 | Chen et al. |
| 9,124,217 | B2 | 9/2015 | Xue et al. |
| 9,219,444 | B2 | 12/2015 | Borodulin et al. |
| 9,362,871 | B2 | 6/2016 | Qureshi |
| 9,608,573 | B2 | 3/2017 | Wang et al. |
| 9,667,199 | B1 | 5/2017 | McLaren |
| 10,103,690 | B2 | 10/2018 | Yanduru et al. |
| 10,447,209 | B2 * | 10/2019 | Wang ...................... H03F 3/211 |
| 2006/0044060 | A1 | 3/2006 | Shiikuma |
| 2006/0114060 | A1 | 6/2006 | Hellberg et al. |
| 2008/0122542 | A1 | 5/2008 | Bowles et al. |
| 2012/0025915 | A1 | 2/2012 | Ui |
| 2013/0099867 | A1 | 4/2013 | Cui et al. |
| 2013/0127527 | A1 | 5/2013 | Chen et al. |
| 2013/0154731 | A1 | 6/2013 | Gajadharsing |
| 2014/0320214 | A1 | 10/2014 | Liu |
| 2015/0180428 | A1 | 6/2015 | Pham et al. |
| 2015/0229282 | A1 * | 8/2015 | Kaehs ....................... H03F 3/24 375/297 |
| 2015/0295542 | A1 | 10/2015 | Moronval et al. |
| 2016/0142020 | A1 * | 5/2016 | Wang ........................ H03F 3/19 330/295 |
| 2017/0033786 | A1 | 2/2017 | Prevost |
| 2018/0183388 | A1 | 6/2018 | Pham |
| 2022/0271715 | A1 * | 8/2022 | Geng ....................... H03F 3/213 |
| 2023/0268889 | A1 * | 8/2023 | Eroglu .................... H03F 3/265 330/124 R |
| 2024/0275410 | A1 * | 8/2024 | Pagnanelli .............. H03F 3/605 |

FOREIGN PATENT DOCUMENTS

| | | | |
|---|---|---|---|
| CN | 110291717 | A | 9/2019 |
| EP | 2608400 | A1 | 6/2013 |
| EP | 2403135 | B1 | 12/2013 |
| RU | 125011 | U1 | 2/2013 |
| SU | 65144 | A3 | 11/1944 |
| WO | 2007129118 | A1 | 11/2007 |
| WO | 2017036093 | A1 | 3/2017 |

OTHER PUBLICATIONS

Office Action for Chinese Patent Application No. 201780091356.2, mailed Jan. 5, 2023, 8 pages.
Sneijers, Walter, "Doherty Architectures in UHF White Paper," ampleon.com/documents/white-paper/AMP-WP-2016-0826, Aug. 31, 2016, Ampleon, Netherlands, 14 pages.
Summons to Attend Oral Proceedings for European Patent Application No. 17918391.8, mailed Jan. 25, 2023, 13 pages.
Chu, James, "Application of ET Techniques," IEEE Microwave Magazine, Book/Software Reviews, URL: https:// eeexplore.ieee.org/stamp/stamp.jsp?arnumber=7153054, Jul. 10, 2015, pp. 98-102
He, Jingchu, et al., "A 500-W High Efficiency LDMOS Classical Three-way Doherty Amplifier for Base-Station Applications," International Microwave Symposium, May 22, 2016, 4 pages.
Moronval, X. et al., "A 100 W Multi-Band Four-Way Integrated Doherty Amplifier," IEEE MTT-S International Microwave Symposium (IMS), San Francisco, CA, 2016, 3 pages.
Pelk, Marco J., et al., "A High-Efficiency 100-W GaN Three-Way Doherty Amplifier for Base-Station Applications," IEEE Transactions on Microwave Theory and Techniques, vol. 56, No. 7, Jul. 2008, pp. 1582-1591.
Srirattana, Nuttapong, et al., "Analysis and Design of a High-Efficiency Multistage Doherty Power Amplifier for Wireless Communications," IEEE Transactions on Microwave Theory and Techniques, vol. 53, No. 3, Mar. 2005, pp. 352-860.
Yao, Jincong, et al., "A Novel Four Stage 200W Doherty Power Amplifier for DVB-T Transmitter," International Conference on Microwave and Millimeter Wave Technology (ICMMT), IEEE, Shenzhen, 2012, 3 pages.
Examination Report for African Regional Intellectual Property Organization Patent Application No. AP/P/2019/011973, mailed Jun. 21, 2021, 4 pages.
Examination Report No. 1 for Australian Patent Application No. 2017423697, mailed Jun. 9, 2020, 4 pages.
Office Action for Canadian Patent Application No. 3066643, mailed Feb. 9, 2021, 4 pages.
Office Action for Canadian Patent Application No. 3066643, mailed Oct. 27, 2021, 4 pages.
Office Action for Colombian Patent Application No. NC2019/0012073, mailed Nov. 26, 2021, 18 pages.
Extended European Search Report for European Patent Application No. 17918391.8, mailed Feb. 2, 2021, 9 pages.
Examination Report for European Patent Application No. 17918391.8, mailed Aug. 30, 2021, 4 pages.
Examination Report for Indian Patent Application No. 201947048270, mailed Oct. 8, 2021, 6 pages.
Notice of Reasons for Rejection for Japanese Patent Application No. 2019-565377, mailed Jan. 12, 2021, 5 pages.
Notice of Reasons for Rejection for Japanese Patent Application No. 2019-565377, mailed Sep. 14, 2021, 6 pages.
Notification of Reason for Refusal for Korean Patent Application No. 10-2019-7033839, mailed May 27, 2021, 7 pages.
Official Action for Russian Patent Application No. 2019138620, mailed Jun. 5, 2020, 11 pages.
International Search Report and Written Opinion for International Patent Application No. PCT/CN2017/093777, mailed Apr. 25, 2018, 10 pages.
Non-Final Office Action for U.S. Appl. No. 16/617,204, mailed Dec. 9, 2020, 6 pages.
Final Office Action for U.S. Appl. No. 16/617,204, mailed Apr. 19, 2021, 8 pages.
Advisory Action for U.S. Appl. No. 16/617,204, mailed Jul. 27, 2021, 3 pages.
Notice of Allowance for U.S. Appl. No. 16/617,204, mailed Sep. 21, 2021, 6 pages.
Decision to Grant for Japanese Patent Application No. 2019-565377, mailed May 17, 2022, 5 pages.
Second Office Action for Chinese Patent Application No. 201780091356.2, mailed Jul. 29, 2023, 22 pages.
Decision to Refuse for European Patent Application No. 17918391.8, mailed Jun. 20, 2023, 12 pages.

* cited by examiner (a) Prior Art : Three-Stage Doherty PA (b) Present Invention : Three-Stage Doherty PA (a) Lineup configuration in prior arts (b) Lineup configuration in present invention

MULTISTAGE DOHERTY POWER AMPLIFIER AND TRANSMITTER

This application is a continuation of U.S. patent application Ser. No. 16/617,204, filed Nov. 26, 2019, now U.S. Pat. No. 11,239,869, which is a 35U.S.C. § 371 national phase filing of International Application No. PCT/CN2017/093777, filed Jul. 21, 2017, the disclosures of which are incorporated herein by reference in their entireties.

TECHNICAL FIELD

Embodiments of the present disclosure generally relate to the field of communications, and more particularly, to a multistage Doherty power amplifier and a transmitter.

BACKGROUND

At cellular base stations of the 4th generation (4G) mobile communication system and beyond, advanced digital modulation scheme is used for high spectrum efficiency. The radio frequency (RF) signal exhibits a large peak to average power ratio (PAPR), which is amplified at a power amplifier (PA). Therefore, the instantaneous transmit power will change dramatically in amplitude. As such, traditional RF PA would suffer from rather low average efficiency with high PAPR stimulus.

One way of increasing the efficiency of an RF PA is to use a Doherty power amplifier (Doherty PA). The classic Doherty PA, or normal Doherty PA in this disclosure, is used to enhance efficiency for high PAPR signal, which creates a second efficiency peak point at 6 dB far away from the peak output power during back offs. However, with ever increasing PAPR, the main challenges for a Doherty PA are the limited Doherty region to maintain high efficiency with PAPR being greater than 6 dB.

This section introduces aspects that may facilitate a better understanding of the disclosure. Accordingly, the statements of this section are to be read in this light and are not to be understood as admissions about what is in the prior art or what is not in the prior art.

SUMMARY

The inventor has found that the concept of Doherty has been extended to multistage (i.e. more than two stages) variants. This allows the efficiency to be kept high over a broader range of output power levels for varying amplitude distributions. Meanwhile, the average efficiency for a specific amplitude distribution and a specific power level can be increased.

However, two problems associated with a multistage Doherty PA have been identified: the problem of low efficiency, if amplifiers (transistors) with limited gain are used, and the problem of poor linearity. The low efficiency is caused by the excessive drive power dissipation to guarantee high linearity at driver stage, which is needed if conventional multistage Doherty PA implementations are used. This problem is especially pronounced if the power amplifiers in the Doherty PA have low gain. The poor linearity is caused by the fact that in the conventional multistage Doherty PA, some of the amplifiers (all but the power amplifiers of the two top stages) are required to saturate at certain transition points and remain saturated above these transition points.

To solve at least part of the above problems, a multistage Doherty PA and a transmitter are provided in the present disclosure. It can be appreciated that embodiments of the present disclosure are not limited to a multiple input multiple output (MIMO) transmitter system, but could be more widely applied to any application scenario where similar problems exist.

Various embodiments of the present disclosure mainly aim at providing a multistage Doherty PA and a transmitter, for example, in a MIMO transmitter system. The transmitter could be, for example, a terminal device or a network device. Other features and advantages of embodiments of the present disclosure will also be understood from the following description of specific embodiments when read in conjunction with the accompanying drawings, which illustrate, by way of example, the principles of embodiments of the present disclosure.

In general, embodiments of the present disclosure provide a concept of nested multistage Doherty PA to overcome the problems pointed out in the above description.

In a first aspect, a multistage Doherty power amplifier is provided. The multistage Doherty power amplifier includes: a generalized carrier amplifier, which is a nested 2-way inverted Doherty sub amplifier, and a generalized peaking amplifier, connected to the generalized carrier amplifier, which is a nested single ended sub amplifier or a nested 2-way normal Doherty sub amplifier, the generalized carrier amplifier and the generalized peaking amplifier are arranged in a generalized 2-way inverted Doherty power amplifier form.

In one embodiment, the generalized carrier amplifier includes a sub carrier amplifier and a first sub peaking amplifier connected to the sub carrier amplifier, the sub carrier amplifier is of a first semiconductor feature, and the first sub peaking amplifier is of a second semiconductor feature with harmonic termination, and amplifier efficiency of first sub peaking amplifier is higher than that of the sub carrier amplifier.

In one embodiment, the generalized peaking amplifier includes a second sub peaking amplifier, the second sub peaking amplifier is of the first semiconductor feature.

In an implementation of this embodiment, the bias voltage values of the sub carrier amplifier and the sub second peaking amplifier are positive, and the bias voltage value of the first sub peaking amplifier is negative.

In an implementation of this embodiment, the power ratio among the sub carrier amplifier, the first sub peaking amplifier and the second sub peaking amplifier is determined according to power distribution function (PDF) of high peak to average power ratio (PAPR) signal applied.

In an implementation of this embodiment, the first semiconductor feature is LDMOS, the second semiconductor feature is GaN HEMT.

In an implementation of this embodiment, the power gain of the first sub peaking amplifier is greater than that of the sub carrier amplifier for power gain extension, the power gain of the sub carrier amplifier is compressed to predetermined compression level, and the power gain of the first peaking amplifier is not compressed.

In an implementation of this embodiment, characteristic of the power gain extension is an inverse characteristic to a driver amplifier connected to the multistage Doherty power amplifier in line up or in cascade, so as to perform predistortion to the driver amplifier.

In another embodiment, the generalized peaking amplifier comprises multiple sub peaking amplifiers, last stage sub peaking amplifier is of a first semiconductor feature, other-stage sub peaking amplifiers excluding the last stage sub peaking amplifier are of a second semiconductor feature, and amplifier efficiency of the other-stage sub peaking amplifiers excluding the last stage sub peaking amplifier is higher than that of the last stage sub peaking amplifier.

In an implementation of this embodiment, the bias voltage values of the sub carrier amplifier and the last stage sub peaking amplifier are positive, and the bias voltage values of the first sub peaking amplifier and the other-stage sub peaking amplifiers excluding the last stage sub peaking amplifier are negative.

In an implementation of this embodiment, the power ratio among the sub carrier amplifier, the first sub peaking amplifier, and the multiple sub peaking amplifiers is determined according to power distribution function (PDF) of high peak to average power ratio (PAPR) signal applied.

In an implementation of this embodiment, the first semiconductor feature is LDMOS, the second semiconductor feature is GaN HEMT.

In an implementation of this embodiment, the power gains of other-stage sub peaking amplifiers excluding the last stage sub peaking amplifier are higher than that of the first sub peaking amplifier for power gain extension, the power gain of each stage sub peaking amplifier of the other-stage sub peaking amplifiers excluding the last stage sub peaking amplifier is higher than that of its prior stage sub peaking amplifier for power gain extension, the power gain of the sub carrier amplifier is compressed to a predetermined compression level, and the power gains of the other-stage sub peaking amplifiers excluding the last stage sub peaking amplifier are not compressed.

In an implementation of this embodiment, characteristic of the power gain extension is an inverse to a driver amplifier connected to the multistage Doherty power amplifier in line up or in cascade, so as to perform pre-distortion to the driver amplifier.

In an implementation of this embodiment, the generalized peaking amplifier comprises 3 sub peaking amplifiers to form a 4-stage Doherty power amplifier.

In a second aspect, a transmitter is provided. The transmitter includes a signal processor, configured to perform signal processing on base band input signals of multiple channels; and a multistage Doherty power amplifier as described in the first aspect.

In a third aspect, a device is provided. The device includes a processor, a memory, and a transmitter, the memory contains program including instructions executable by the processor, and the transmitter is as described in the second aspect.

In one embodiment, the device is a terminal device.

In another embodiment, the device is a network device.

According to various embodiments of the present disclosure, signal power probability distribution function (PDF) oriented for a cost-effective multistage Doherty PA design is applied, and 2-way normal and inverted Doherty PA cells are used as basic units to construct multistage Doherty PA with gain extension effect.

According to various embodiments of the present disclosure, the Doherty output power back off range is segmented for different design. Different semiconductor processes based transistors are used at the same time for different segmented output power back off range. They are separated designed for different demands for power, efficiency and cost.

According to various embodiments of the present disclosure, gain extension effect is used to compensate the non-linearity of driver amplifier. Therefore, the overall lineup efficiency will be improved.

BRIEF DESCRIPTION OF THE DRAWINGS

The above and other aspects, features, and benefits of various embodiments of the disclosure will become more fully apparent, by way of example, from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which.

DETAILED DESCRIPTION

Figure 1:
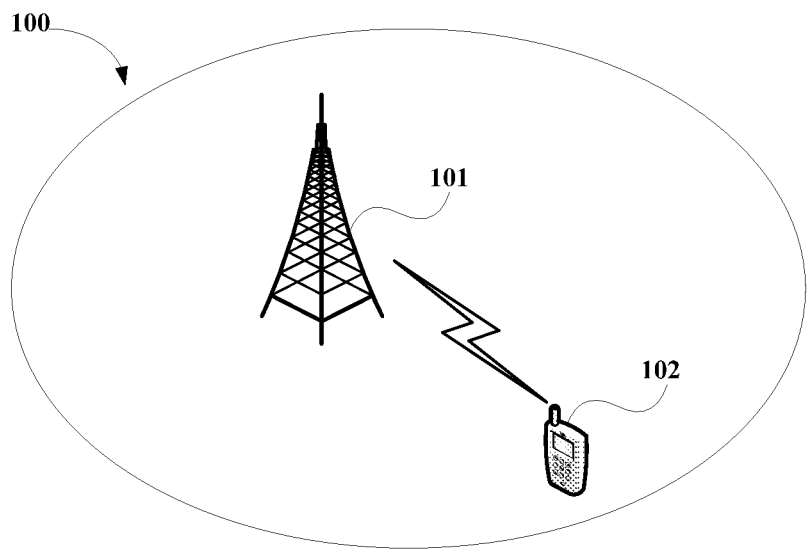
FIG. 1 is a schematic diagram of a cell of wireless communication network.

The present disclosure will now be described with reference to several example embodiments. It should be understood that these embodiments are discussed only for the purpose of enabling those skilled persons in the art to better understand and thus implement the present disclosure, rather than suggesting any limitations on the scope of the present disclosure.

As used herein, the term "wireless communication network" refers to a network following any suitable communication standards, such as LTE-Advanced (LTE-A), LTE, Wideband Code Division Multiple Access (WCDMA), High-Speed Packet Access (HSPA), and so on. Furthermore, the communications between a terminal device and a network device in the wireless communication network may be performed according to any suitable generation communication protocols, including, but not limited to, the first generation (1G), the second generation (2G), 2.5G, 2.75G, the third generation (3G), the fourth generation (4G), 4.5G, the future fifth generation (5G) communication protocols, and/or any other protocols either currently known or to be developed in the future.

The term "network device" refers to a device in a wireless communication network via which a terminal device accesses the network and receives services therefrom. The network device refers a base station (BS), an access point (AP), a server, a controller or any other suitable device in the wireless communication network. The BS may be, for example, a node B (NodeB or NB), an evolved NodeB (eNodeB or eNB), a gNode B (gNB), a relay, a low power node such as a femto, a pico, and so forth.

Yet further examples of network device include multi-standard radio (MSR) radio equipment such as MSR BSs, base transceiver stations (BTSs), transmission points, transmission nodes. More generally, however, network device may represent any suitable device (or group of devices) capable, configured, arranged, and/or operable to enable and/or provide a terminal device access to the wireless communication network or to provide some service to a terminal device that has accessed the wireless communication network.

The term "terminal device" refers to any end device that can access a wireless communication network and receive services therefrom. By way of example and not limitation, the terminal device refers to a mobile terminal, user equipment (UE), or other suitable device. The UE may be, for example, a Subscriber Station (SS), a Portable Subscriber Station, a Mobile Station (MS), or an Access Terminal (AT). The terminal device may include, but not limited to, portable computers, image capture terminal devices such as digital cameras, gaming terminal devices, music storage and playback appliances, a mobile phone, a cellular phone, a smart phone, a tablet, a wearable device, a personal digital assistant (PDA), a vehicle, and the like.

The terminal device may support device-to-device (D2D) communication, for example by implementing a 3GPP standard for sidelink communication, and may in this case be referred to as a D2D communication device.

As yet another specific example, in an Internet of Things (IoT) scenario, a terminal device may represent a machine or other device that performs monitoring and/or measurements, and transmits the results of such monitoring and/or measurements to another terminal device and/or a network equipment. The terminal device may in this case be a machine-to-machine (M2M) device, which may in a 3GPP context be referred to as a machine-type communication (MTC) device.

As one particular example, the terminal device may be a UE implementing the 3GPP narrow band internet of things (NB-IoT) standard. Particular examples of such machines or devices are sensors, metering devices such as power meters, industrial machinery, or home or personal appliances, e.g. refrigerators, televisions, personal wearable computing device such as watches etc. In other scenarios, a terminal device may represent a vehicle or other equipment that is capable of monitoring and/or reporting on its operational status or other functions associated with its operation.

As used herein, the terms "first" and "second" refer to different elements. The singular forms "a" and "an" are intended to include the plural forms as well, unless the context clearly indicates otherwise. The terms "comprises," "comprising," "has," "having," "includes" and/or "including" as used herein, specify the presence of stated features, elements, and/or components and the like, but do not preclude the presence or addition of one or more other features, elements, components and/or combinations thereof. The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Now some exemplary embodiments of the present disclosure will be described below with reference to the figures. Reference is first made to FIG. 1, which shows a schematic diagram of a wireless communication network 100. There illustrates a network device 101 and a terminal device 102 in the wireless communication network 100. In the example of FIG. 1, the network device 101 serves for the terminal device 102.

It is to be understood that the configuration of FIG. 1 is described merely for the purpose of illustration, without suggesting any limitation as to the scope of the present disclosure. Those skilled in the art would appreciate that the wireless communication network 100 may include any suitable number of terminal devices and/or network devices and may have other suitable configurations.

For convenience, in the following embodiments, descriptions are given taking MIMO system as an example, but the embodiments are not limited thereto, any systems related on multi-channel power amplifier such as satellite system etc., are all feasible in the present disclosure.

In order to solve at least one of the problems described in the SUMMARY, i.e. the problem of low efficiency and the problem of poor linearity, the present disclosure is proposed. The embodiments of this disclosure shall be described below with reference to the accompanying drawings and particular implementations.

A First Aspect of Embodiments

A multistage Doherty power amplifier is provided in this embodiment. The multistage Doherty power amplifier is implemented at a transmitter, such as a multi-antenna transmitter at a terminal device or at a network device.

Figure 2:
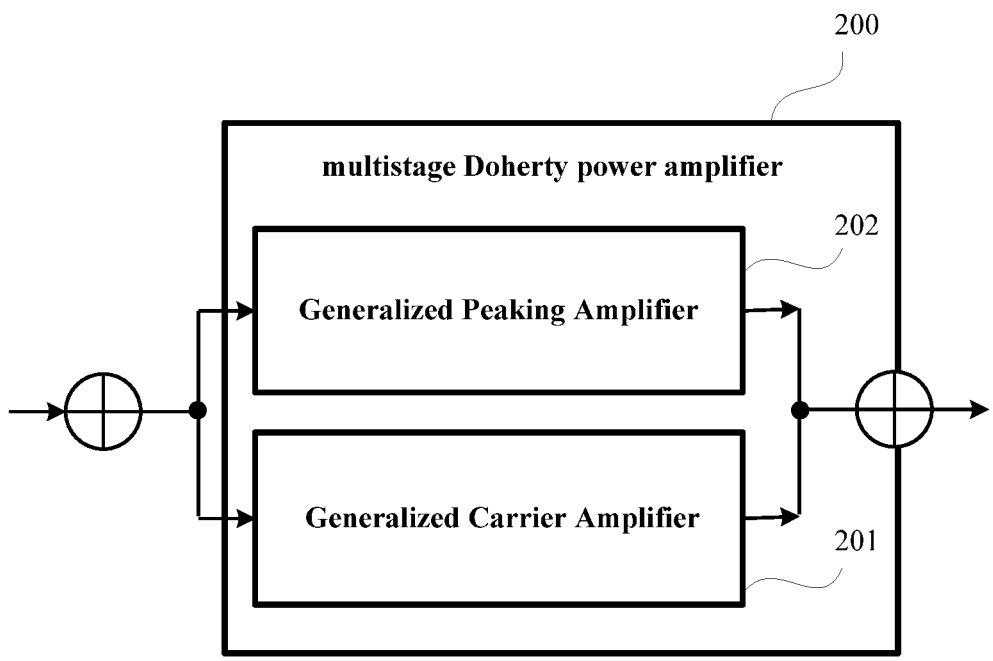
FIG. 2 shows a block diagram of a multistage Doherty PA of the present disclosure.

FIG. 2 illustrates a block diagram of the multistage Doherty power amplifier 200 of the present disclosure. As shown in FIG. 2, the multistage Doherty power amplifier 200 may include: a generalized carrier amplifier 201 and a generalized peaking amplifier 202. The generalized carrier amplifier 201 is a nested 2-way inverted Doherty sub amplifier, and the generalized peaking amplifier 202 is a nested single ended sub amplifier or a nested 2-way normal Doherty sub amplifier. In this embodiment, the generalized carrier amplifier 201 and the generalized peaking amplifier 202 are arranged in a generalized 2-way inverted Doherty power amplifier form, thus the multistage Doherty power amplifier 200 is in a generalized inverted Doherty topology. By this arrangement, smart bias scheme, analog pre-distortion, and step-wise Doherty operation segmenting can be realized as described below.

In this embodiment, the multistage Doherty PA 200 includes multiple nested sub amplifier cells for generalized carrier and peaking amplification, respectively. Therefore, it is a nested Doherty PA with global inverted Doherty configuration but inverted Doherty for carrier sub amplifier and normal Doherty for peaking sub amplifier respectively.

In this embodiment, the multistage Doherty PA includes unit amplifiers as 2-way Doherty amplifier cells. For the generalized carrier amplifier, the Doherty cell is in inverted structure. For the generalized peaking amplifier, the Doherty cell is in normal Doherty structure. The global structure is an inverted Doherty PA.

In this embodiment, the multiple nested sub amplifiers of the multistage Doherty PA are not uniformly designed and they are dedicated for specialized output power back off range based on power distribution function (PDF) of high PAPR signal. Therefore, the semiconductor process and design metrics for some of the sub amplifiers are different. In this embodiment, central cells along Doherty region should be prioritized for efficiency, side cells should be prioritized for linearity, cost or high power level. For example, the side cells may be formed by using semiconductor processes of LDMOS, and the central cells may be formed by using semiconductor processes of GaN HEMT.

In this embodiment, the power ratio is defined by the PDF, i.e. the power ratio among the sub amplifiers is determined according to PDF of high PAPR signal applied, such that the power of the sub amplifiers can adapt to the PDF of the high PAPR signal applied. The higher the PDF is, the higher efficiency of transistor should be used.

In an implementation, the generalized carrier amplifier 201 includes a sub carrier amplifier and a first sub peaking amplifier, the generalized peaking amplifier 202 includes at least one sub peaking amplifier.

In this implementation, the sub carrier amplifier is of a first semiconductor feature, that is, it is designed by using a first semiconductor process, the first sub peaking amplifier is of a second semiconductor feature, that is, it is designed by using a second semiconductor process with harmonic termination for efficiency enhancement, and amplifier efficiency of first sub peaking amplifier is higher than that of the sub carrier amplifier.

As an example, the generalized peaking amplifier 202 includes a second sub peaking amplifier, the second sub peaking amplifier is of the first semiconductor feature, that is, it is designed by using the first semiconductor process.

In this example, amplifier efficiency of the central cells, i.e. the first sub peaking amplifier of the generalized carrier amplifier 201, is higher than that of the side cells, i.e. the sub carrier amplifier of the generalized carrier amplifier 201 and the second sub peaking amplifier of the generalized peaking amplifier 202.

Figure 3:
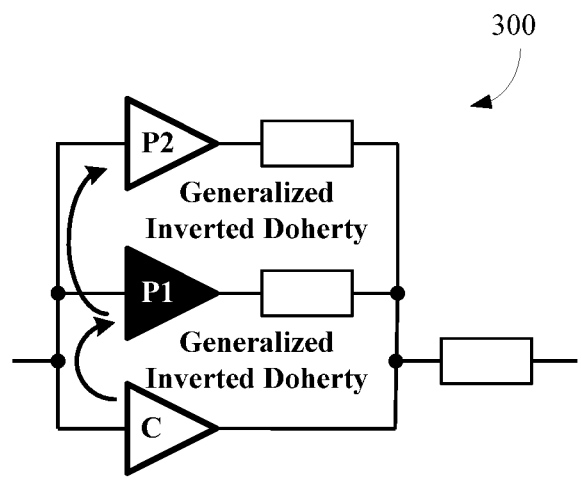
FIG. 3 shows a block diagram of a 3-stage Doherty PA of the present disclosure.

FIG. 3 shows a three-stage Doherty PA 300, as shown in FIG. 3, the three-stage Doherty PA 300 is implemented in a nested manner so that the sub carrier amplifier (C) and the first sub peaking amplifier (P1) construct an inverted Doherty sub amplifier. This inverted Doherty sub amplifier may be used as a generalized carrier amplifier from the viewpoint of the second peaking amplifier (P2). The generalized carrier amplifier and the second peaking amplifier (P2) form another inverted Doherty, i.e. the multistage Doherty power amplifier 200. Furthermore, the first sub peaking amplifier (P1) uses high efficiency semiconductor process with harmonic termination for efficiency enhancement, such as GaN HEMT, while the sub carrier amplifier (C) and the second peaking amplifier (P2) use mid efficiency semiconductor process with less cost, such as LDMOS.

As another example, the generalized peaking amplifier 202 includes multiple sub peaking amplifiers, the last stage sub peaking amplifier is of the first semiconductor feature, that is, it is designed by using the first semiconductor process, the other-stage sub peaking amplifiers excluding the last stage sub peaking amplifier are of the second semiconductor feature, that is, they are designed by using the second semiconductor process, and as described above, amplifier efficiency of the other-stage sub peaking amplifiers excluding the last stage sub peaking amplifier is higher than that of the last stage sub peaking amplifier.

In this example, the amplifier efficiency of the central cells, i.e. the first sub peaking amplifier of the generalized carrier amplifier 201 and the other stage sub peaking amplifiers excluding the last stage sub peaking amplifier of the generalized peaking amplifier 202, is higher than that of the side cells, i.e. the sub carrier amplifier of the generalized carrier amplifier 201 and the last stage sub peaking amplifier of the generalized peaking amplifier 202.

Figure 4:
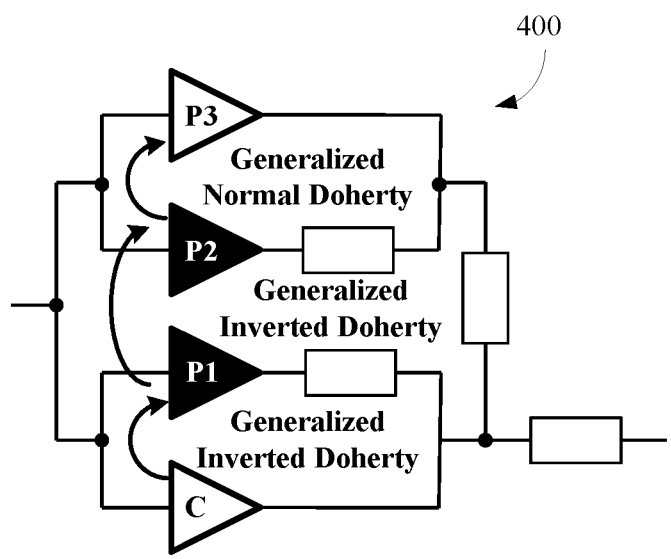
FIG. 4 shows a block diagram of a four-stage Doherty PA of the present disclosure.

FIG. 4 shows a four-stage Doherty PA 400, as shown in FIG. 4, the four-stage Doherty PA 400 is implemented in a nested manner so that an inverted Doherty sub amplifier formed by the sub carrier amplifier (C) and the first sub peaking amplifier (P1) can function as generalized carrier amplifier 201, a normal Doherty sub amplifier formed by the second sub peaking amplifier (P2) and the third sub peaking amplifier (P3) can function as generalized peaking amplifier 202. The overall Doherty PA 400 is in an inverted Doherty topology formed by the generalized sub amplifier cells. Moreover, the central cells, i.e. the first sub peaking amplifier (P1) and the second sub peaking amplifier (P2) use high efficiency semiconductor process with harmonic termination for efficiency enhancement, such as GaN HEMT, while the side cells, i.e. the sub carrier amplifier (C) and the third sub peaking amplifier (P3) use mid efficiency semiconductor process with less cost, such as LDMOS.

By utilizing the topologies shown in FIGS. 3-4, some advanced features can be achieved in this embodiment. Specifically, the peak efficiency points in theory are not constantly or uniformly distributed. In this embodiment, the peak efficiency points are taking weights given by the PDF of the high PAPR signal applied. They are prioritized and shaped by the probability of power distribution. Therefore, the PA design is more flexible to adapt to various signal characteristics. For example, FIG. 5 and FIG. 6 illustrate the efficiency versus output power back off 3-stage and 4-stage Doherty PA embodiments in the present disclosure respectively, in comparison with high PAPR signal PDF plot.

Figure 5:
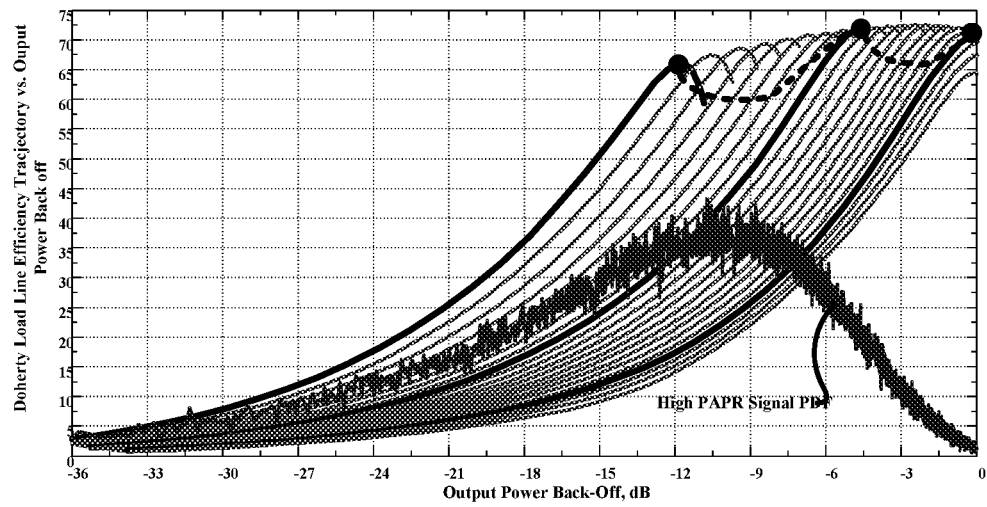
FIG. 5 shows a generalized 3-stage Doherty PA in present disclosure for "step-wise" handling of segmented Doherty operation regions.
Figure 5:
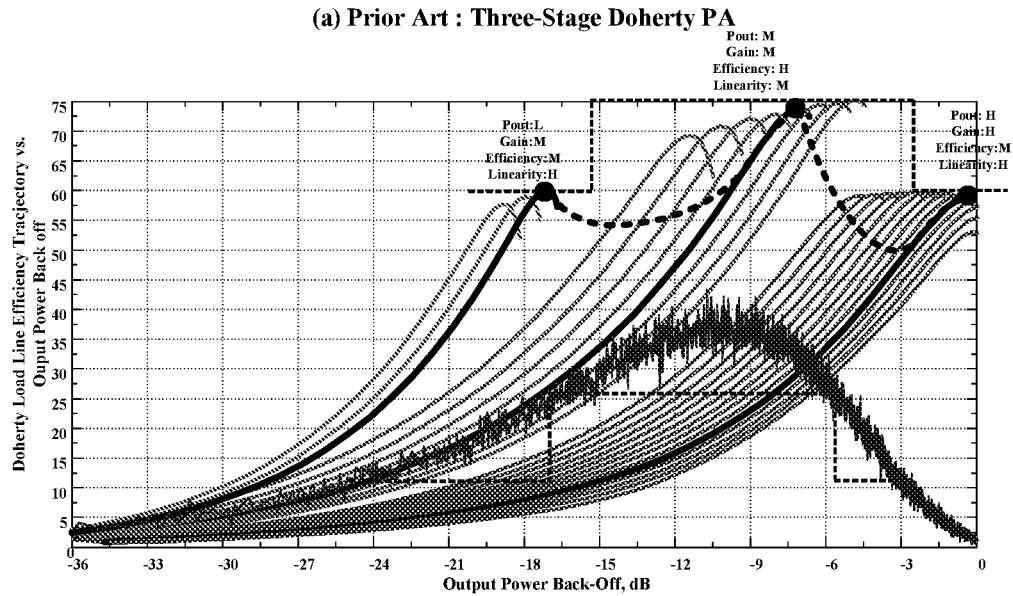

In FIG. 5, as shown in (a), the existing solutions did not prioritize the amplifier design parameters for different regions of Doherty operation, which for some low power probability area, the efficiency and power assigned are as high as the high power probability area. As shown in (b), in the present disclosure, Doherty regions are divided into three, the center peaking efficiency point uses high efficiency PA (P1) with harmonic termination to prioritize efficiency. And the side peaking efficiency points are only in the low power probability areas. Therefore, side peaking efficiency points can be treated with lower priority for efficiency, which may help to decrease costs.

Figure 6:
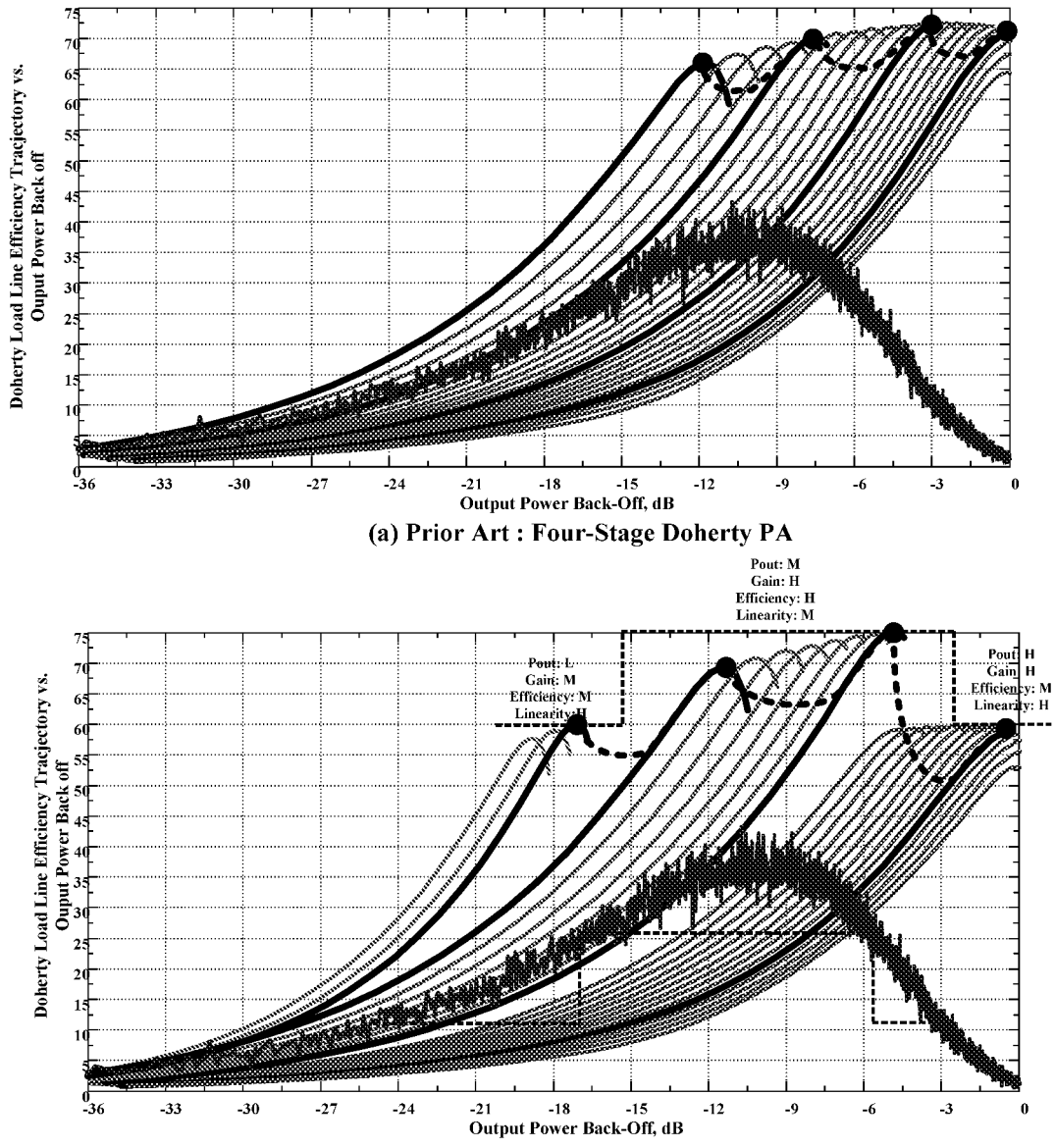
FIG. 6 shows a generalized 4-stage Doherty PA in present disclosure for "step-wise" handling of segmented Doherty operation regions.

In FIG. 6, as shown in (a), the four peaking efficiency points in existing solutions were treated or designed uniformly in semiconductor process and design methodologies, for example, the amplifiers to which the four peaking efficiency points correspond are all made of the GaN HEMT, without considering the PDF of the high PAPR signal applied, such that resource utilization are decreasing and more stages are needed. As shown in (b), in the present disclosure, design parameters are selected differentially, including: output power, gain, efficiency, linearity by different low (L), middle (M) and high (H) levels, according to the profile of the PDF of the high PAPR signal applied.

Figure 7:
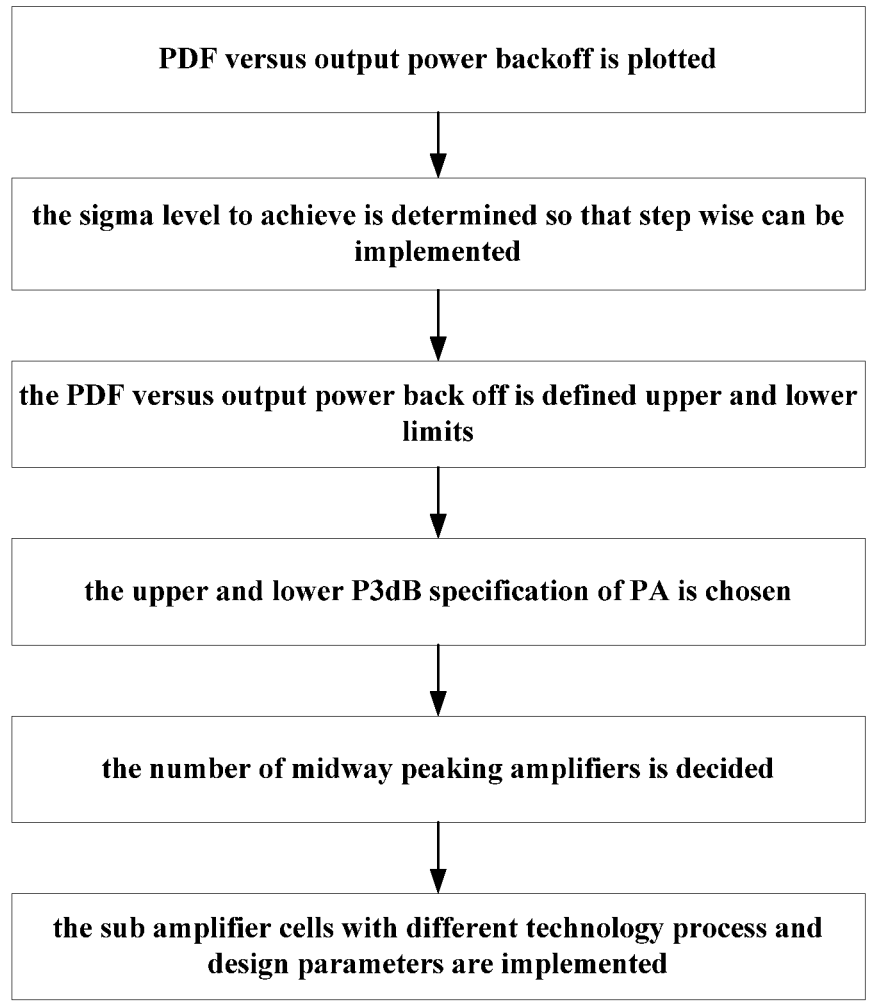
FIG. 7 is a flow chart showing how to use PDF analysis to obtain the Doherty design parameters in present disclosure.

In this embodiment, the design parameters for multistage Doherty PA can be obtained from the PDF of high PAPR signal applied, as illustrated in FIG. 7.

Figure 8:
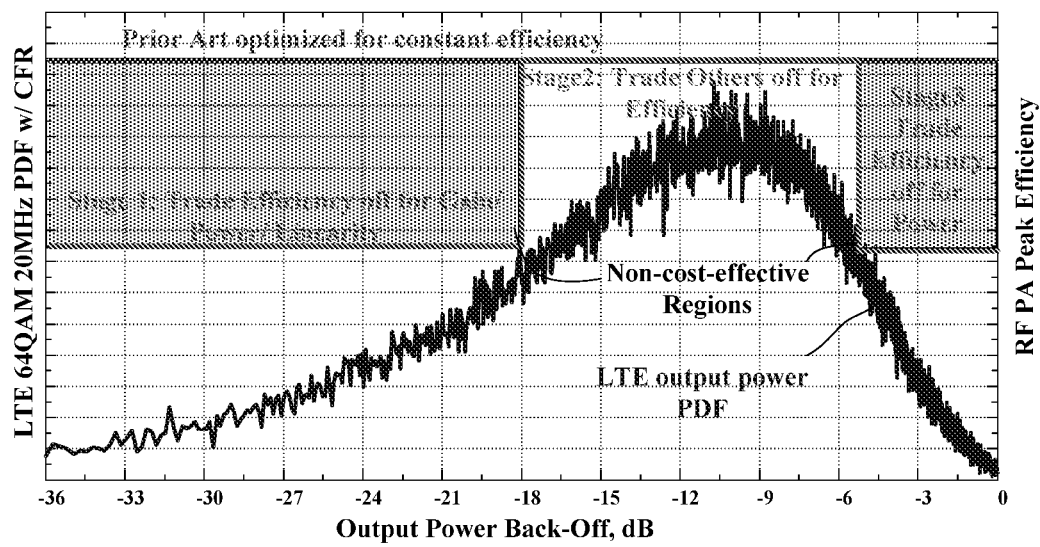
FIG. 8 is an illustration of "step wise" division of Doherty operation region in present disclosure.

With the method illustrated in FIG. 7, the efficiency versus output power back off can be divided into three regions and form a "step-wise" shape mask for Doherty PA design. FIG. 8 illustrates the three steps, that is, stage 1, trade efficiency off for gain and/or power and /or linearity; stage 2, trade others off for efficiency; and stage 3, trade efficiency off for power, which may prioritize different design parameters of a Doherty PA to obtain more efficient resource utilization and produce cost effective solution for multistage Doherty PA design.

In this embodiment, as shown in FIG. 8, the efficiency versus output power back off curve is "step-wise" by employing different technologies, design methodologies etc. Accordingly, as transistors with different semiconductor features are used according to PDF of high PAPR signal applied, a cost effective solution for high power amplifiers is provided.

Figure 9:
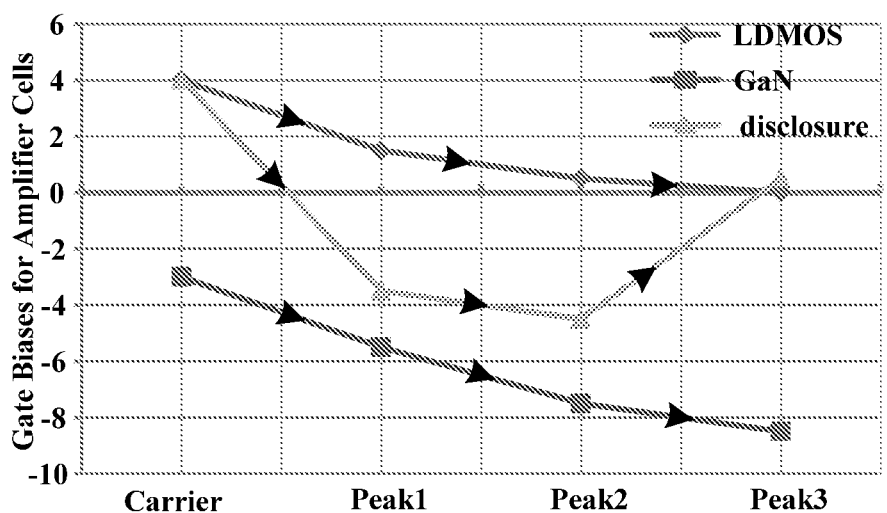
FIG. 9 is an illustration of input bias scheme in present disclosure compared to LDMOS and GaN alone solutions.

In this embodiment, as the side cells are designed by using mid efficiency semiconductor process, such as LDMOS, and the central cell(s) is/are designed by using high efficiency semiconductor process, such as GaN HEMT, the bias voltage values of the side cells are positive, and the bias voltage value(s) of the central cell(s) is(are) negative. Thus, the present disclosure provides a more reasonable input bias scheme compared to existing solutions based on single tech process. FIG. 9 illustrates the input bias (base/gate) schemes of LDMOS and GaN HEMT in existing solutions and the present disclosure (including LDMOS and GaN HEMT) taking four-stage Doherty PA as an example.

By the arrangement shown in FIG. 9, for the LDMOS or the GaN HEMT, the sub amplifier turned on first ("carrier" shown in FIG. 9) in a multistage Doherty PA could not be impacted and provides high efficiency during low power mode. The peaking amplifiers ("peak 1", "peak 2" and "peak 3" shown in FIG. 9) could be shut down completely by applying very negative input bias. However, some PACC (power amplifier control circuit) cannot provide optimal negative bias due to limitations, which makes the last peaking amplifier ("peak 3" shown in FIG. 9) of multistage Doherty PA difficult to be biased at an optimum state.

In comparison, the present disclosure arranges the input bias polarity in an interleaved manner, which uses positive input bias for the carrier amplifier ("carrier" shown in FIG. 9), the middle peaking amplifiers ("peak 1", "peak 2" and "peak 3" shown in FIG. 9) are biased in negative input biases, and the last peaking amplifier ("peak 3" shown in FIG. 9) backs to positive or approaching to zero value as input bias.

With this arrangement, the input bias range will be extended greatly because both positive and negative input biases could be used in a single multistage Doherty PA design. The extended input bias range no longer decreases monotonically, but returns to zero, which only requires limited bias voltage range for multistage Doherty PA design and simplifies the design for proper active load modulation effect. Such that, the difficulty of gate biasing scheme by using uniform semiconductor process is alleviated, the multistage Doherty biasing scheme can be realized in an easier manner In this embodiment, the present disclosure provides an analog predistortion scheme boosting driver stage amplifier and lineup PAE (power added efficiency). That is power gain extension. In the power gain extension, power gain of the latter sub amplifier is greater than that of the former sub amplifier except for the last stage sub amplifier.

Taking three-stage Doherty PA as an example, the power gain of the first sub peaking amplifier is greater than that of the sub carrier amplifier for power gain extension, the power gain of the sub carrier amplifier is compressed to a predetermined compression level, and the power gain of the first peaking amplifier is not compressed.

Taking multistage Doherty PA other than three-stage as an example, the power gains of other-stage sub peaking amplifiers excluding the last stage sub peaking amplifier are higher than that of the first sub peaking amplifier for power gain extension, the power gain of each stage sub peaking amplifier of the other-stage sub peaking amplifiers excluding the last stage sub peaking amplifier is higher than that of its prior stage for power gain extension, the power gain of the sub carrier amplifier is compressed to a predetermined compression level, and the power gains of the other-stage sub peaking amplifiers excluding the last stage sub peaking amplifier are not compressed. For four-stage Doherty PA, power gain of the first sub peaking amplifier is greater than that of the carrier sub amplifier, power gain of the second sub peaking amplifier is greater than that of the first sub peaking amplifier.

In this embodiment, the gain extension characteristic is an inverse characteristic to a driver amplifier connected to the multistage Doherty power amplifier in line up or in cascade, so that the power gain compression of the driver amplifier can be compensated, that is performing pre-distortion to the driver amplifier.

Figure 10:
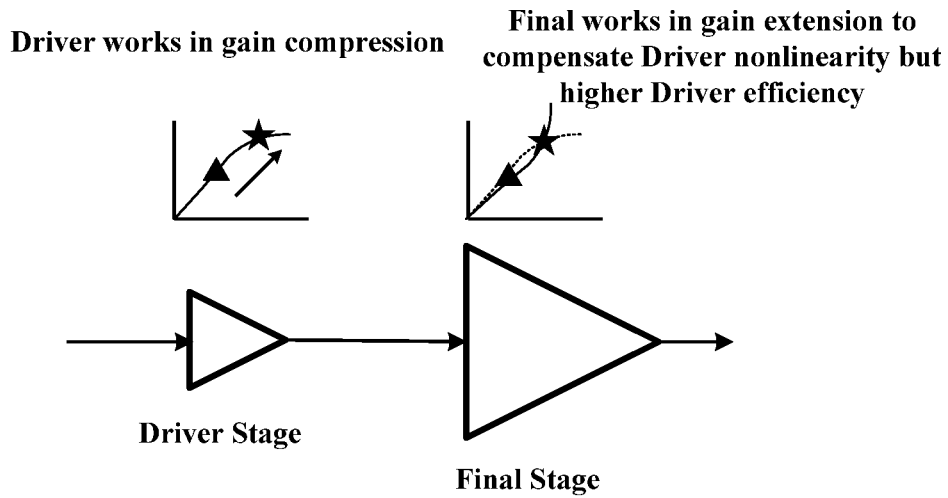
FIG. 10 is an illustration of analog predistortion scheme in present disclosure.

FIG. 10 illustrates an analog predistortion scheme in present disclosure. As illustrated in FIG. 10, by manipulating the multiple stages in Doherty PA, a gain extension effect can be obtained by using different semiconductor processes and design parameters at final stage amplifier in this disclosure. As what is known, the gain compression effect is more common for PA. An inverse characteristic of gain compression can be used in serial arrangement of driver stage amplifier and final stage amplifier (the multistage Doherty PA in the present disclosure) to correct the gain compression occurred in driver amplifier stage. In general, driver stage amplifier will not be pushed so hard into saturation so that acceptable linearity can be obtained to leave design margin for final stage amplifier in a lineup configuration. The main drawback of the existing solutions is that the efficiency of driver amplifier would be very low because it is far away from saturation region. As the driver amplifier efficiency contribution is essential for a line up configuration, therefore, the arrangement in existing solutions of driver stage amplifier would limit the lineup efficiency enhancement.

In the present disclosure, a proper gain extension effect is provided at the final stage amplifier, which can be used to correct the compression effect occurred at driver amplifier, as illustrated in FIG. 10. This allows the driver amplifier to draw more power out under slight compression region, which would greatly help to improve the driver and lineup efficiency. This can be completed by using the sub amplifier design in present disclosure, as illustrated in FIG. 11.

Figure 11:
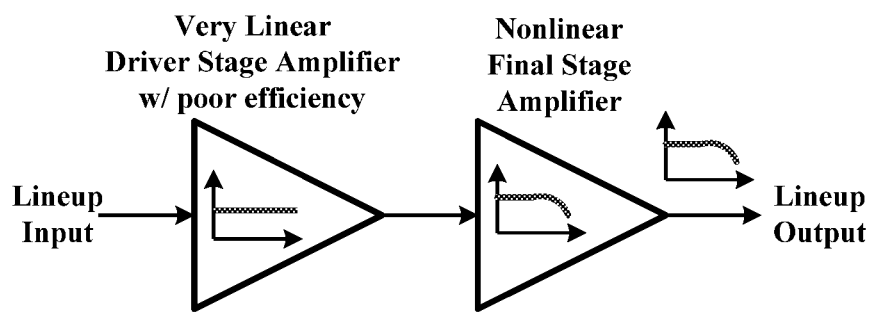
FIG. 11 is a block diagrams of lineup configurations for existing solutions (a) and pre-distorted lineup in present disclosure (b) with higher driver stage and line up efficiency.
Figure 11:
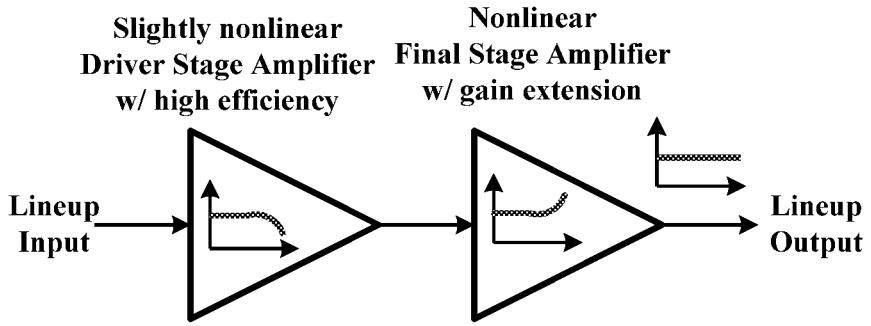

As shown in Figure 11, a new lineup predistotion method using the gain extension of the final stage amplifier (the multistage Doherty PA) is provided. As discussed previously in the present disclosure, the gain extension of the multistage Doherty PA of final stage compensates for the gain compression characteristic of the driver stage PA. This compensation results in an increase of the 3 dB compression point (P3dB) level in the overall lineup amplifier. The effect of increasing P3 dB on the overall linearity can be obtained.

Figure 15:
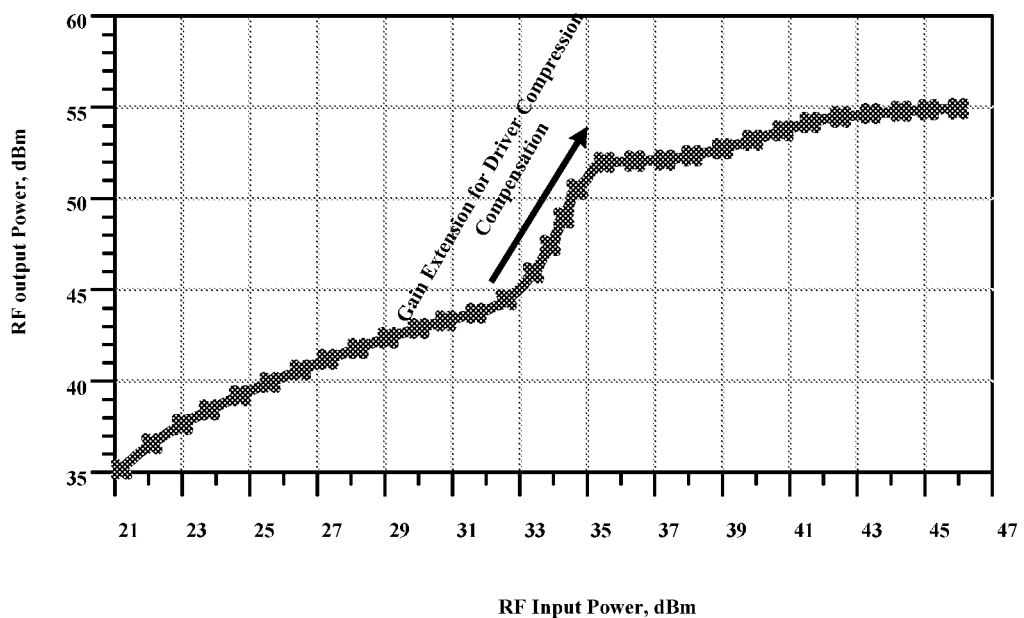
FIG. 15 is an illustration of gain extension effect observation in RF output power versus RF input power in present disclosure.

In FIG. 11, (a) is a lineup configuration for existing solutions, which is constructed using a linear driver stage amplifier and a final stage amplifier. In FIG. 11, (b) is the proposed structure in which the gain extension of final stage amplifier, which precedes the same final stage amplifier, as in FIG. 11(a). As seen from FIG. 11(b), the present disclosure can compensate the AM-AM characteristics of the lineup, which are shown in FIG. 15. Compared with the existing solutions, the gain characteristic of the proposed lineup structure shows better linearity due to the gain extension counteracting gain compression of the final stage amplifier. Compared with the existing solutions, the adjacent channel power ratio (ACPR) of the predistorted lineup is improved due to the gain compensation by the multistage Doherty PA of the final stage. Also, the complementary cumulative distribution function (CCDF) curves can show how far and how often a signal exceeds the average power. As the power level of the output signal exceeds the P3 dB compression point, the CCDF curve starts being clipped, which indicates the frequency the amplified signal is compressed. The CCDF result of the predistorted lineup amplifier is less clipped compared with the existing solutions.

Figure 12:
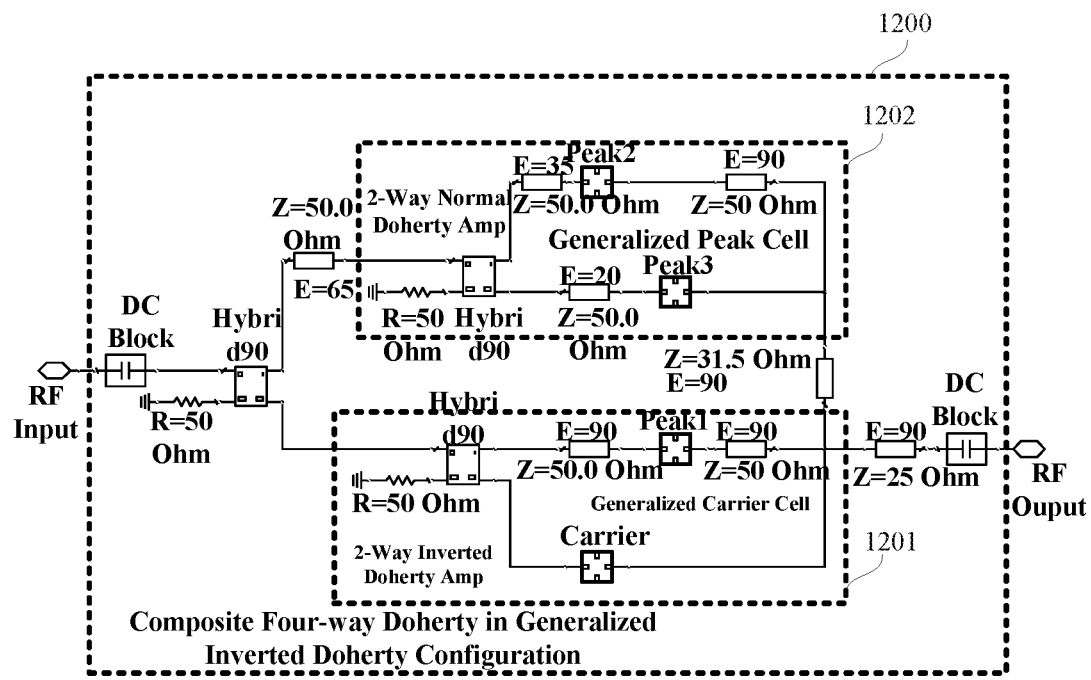
FIG. 12 is a schematic of the technical implementation of present disclosure as a 4-stage Doherty PA.

The concept of the present disclosure is verified by Keysight Advanced Design System (ADS) simulation, as an example of verifying, FIG. 12 illustrates an exemplary 4-stage Doherty design.

Figure 13:
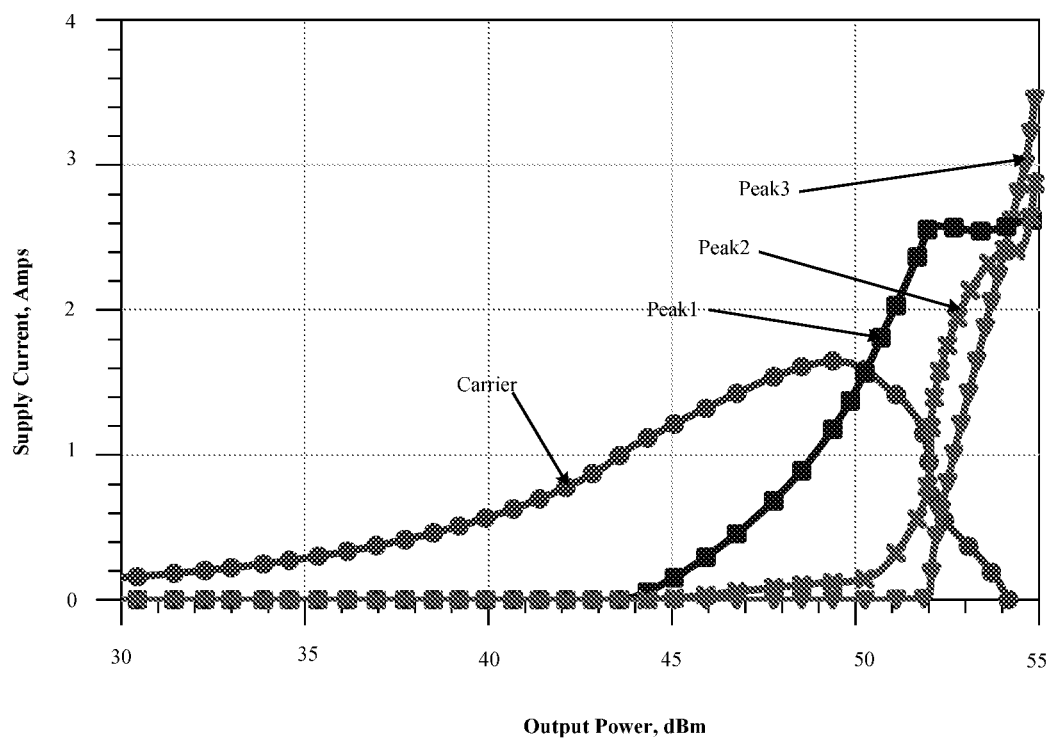
FIG. 13 is an illustration of supply current versus output power in present disclosure.

In FIG. 12, the generalized multistage Doherty PA 1200 is a two-way composite inverted Doherty PA including two sub Doherty amplifiers 1201, 1202. The first sub Doherty amplifier 1201 is a two-way inverted Doherty PA, while the second sub Doherty amplifier 1202 is a two-way normal Doherty PA. Both are combined together with proper sequence to be turned on. The carrier amplifier and the peak 3 amplifier 12021 are implemented in LDMOS process for cost of transistor and high power capability. The peak 2 and peak1 amplifiers are implemented in GaN HEMT process for high efficiency for highest PDF with $2^{nd\ and}\ 3^{rd}$ harmonic terminations. There are three hybrid couplers (shown as Hybrid 90 in FIG. 12) used to distribute the input power into different paths. Offset lines are used to make phase alignment at input side of the design. FIG. 13 illustrates the turning on sequence by observing the amplifier supply current of each sub amplifiers.

Figure 14:
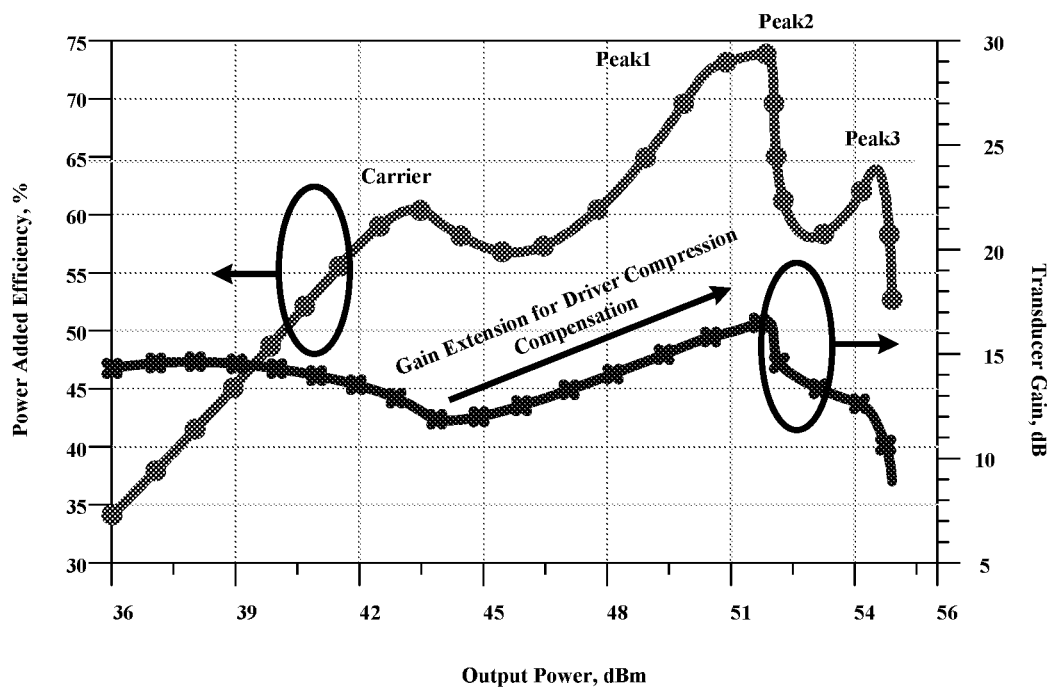
FIG. 14 is an illustration of PAE and gain versus output power and gain extension effect observation in present disclosure.

FIG. 14 illustrates the power added efficiency and transducer gain versus the output power of the 4-stage Doherty PA. The efficiency curve is no longer a smooth one but being shaped according to the signal distribution histogram of the high PAPR signal applied. This is featured as being optimized for power probability distribution. Also, the gain extension effect caused by the transition from LDMOS carrier amplifier to the GaN HEMT peak 2 peaking amplifier can be observed. This is used to linearize the driver amplifier, so that the driver amplifier stage can work into saturation to provide much higher lineup efficiency.

FIG. 15 illustrates the RF output power versus RF input power transfer function plot. With the curve shown in FIG. 15, the gain extension effect created will be understood better.

In order to make the advantages of the present disclosure clear and better to understand, both the problems existing in the existing solutions and the advantages of the present disclosure are described below with reference to the drawings.

As shown in FIG. 8, the conventional Doherty PA designs are optimized for constant high efficiency over broad back off range without selectivity. This strategy may cause some kind of waste, especially for extremely low power probability range. However, the present disclosure prioritizes and optimizes Doherty PA design parameters according to the PDF of the high PAPR signal applied, which can better trade off parameters and the resource utilization.

Furthermore, the existing solutions do not consider roll off characteristics of the PDF of complex signal applied. Conventionally, only peak to average power ratio (PAPR) point is considered for Doherty PA design. Therefore, the details of PDF of signal were ignored, e.g. skew of the PDF of signal is not taken into account. Therefore, the design parameters were not optimized for PDF of signal.

Furthermore, in existing solutions, the semiconductor process is the same for all the sub amplifiers of a Doherty design due to ignoring the PDF of signal. Therefore, the cost and performance cannot be optimized to the maximum benefit. However, the required semiconductor process for PDF of applied signal is indicated in the present disclosure, the selection of transistors can be more flexible for a cost-effective solution. A hybrid mode Doherty PA design can be realized based on the PDF profile of the applied signal.

Furthermore, in the existing solutions, the tuning parameter/degree of Doherty PA design is quite limited. Because there is no room to have segmented optimization for different output power back off range for Doherty PA design. However, in present disclosure, the design could be range-specific for different output power back off ranges. Different processes and parameters could be introduced, which increase more tuning parameter/degrees for high performance Doherty PA design with explicit target: signal PDF oriented PA design.

Finally, in lineup configuration, the driver amplifiers used in the existing solutions must work on very linear region, avoiding more distortions generated from final stage which limits the driver efficiency a lot. In comparison, a gain extension effect may be generated in the present disclosure, which enable the driver amplifier to work into slight saturation region to get higher driver efficiency and thus improve the lineup efficiency.

A Second Aspect of Embodiments

A transmitter is provided in this embodiment, and the same contents as those in the first embodiment are omitted.

Figure 16:
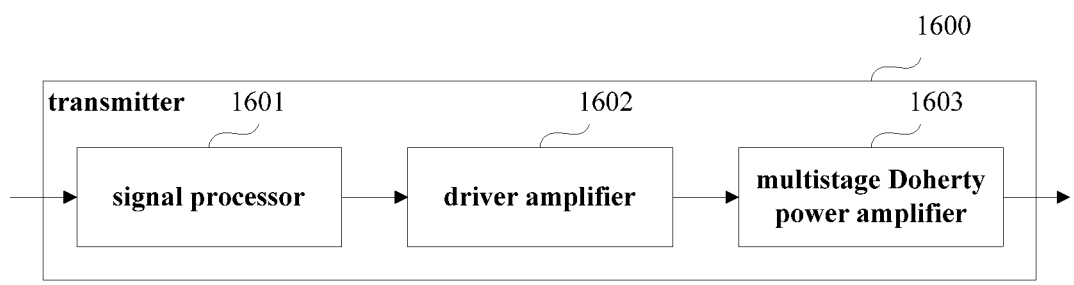
FIG. 16 is a diagram of a transmitter of the present disclosure.

FIG. 16 shows a diagram of the transmitter 1600, as shown in FIG. 16, the transmitter includes a signal processor 1601, a driver amplifier 1602 and a multistage Doherty power amplifier 1603.

For the signal processor 1601 and the driver amplifier 1602, the existing solutions may be referred to, and for the multistage Doherty power amplifier, Embodiment 1 may be referred to, which has been described in details in Embodiment 1, and thus not be described herein any further.

A Third Aspect of Embodiments

An apparatus is provided in these embodiments.

Figure 17:
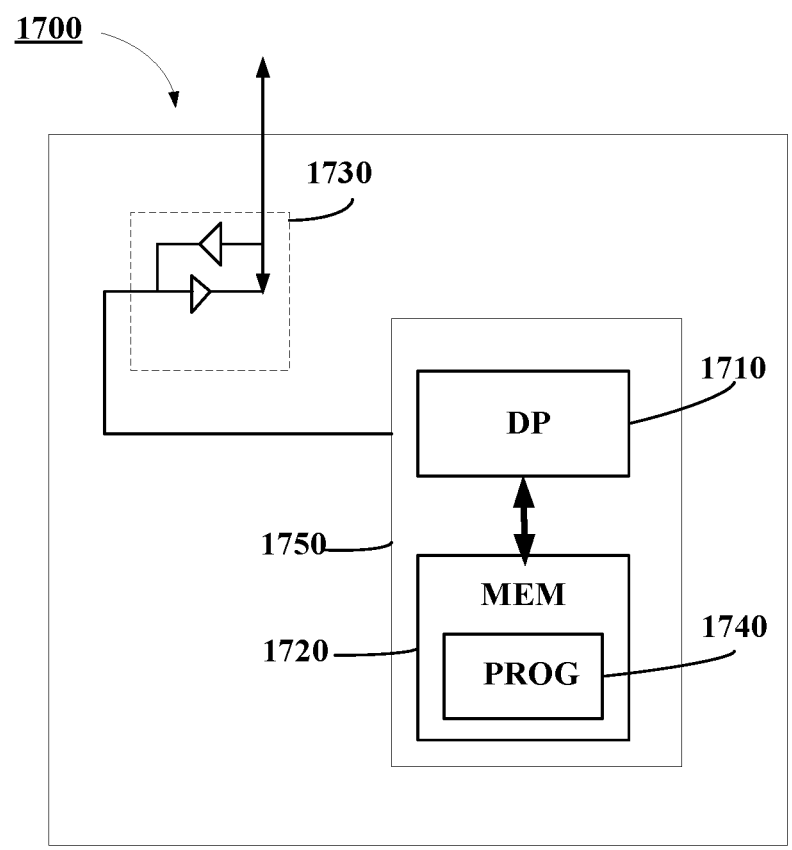
FIG. 17 is a simplified block diagram of an apparatus in accordance with an embodiment of the present disclosure.

FIG. 17 shows a simplified block diagram of an apparatus 1700 in accordance with an embodiment of the present disclosure. It would be appreciated that the apparatus 1700 may be implemented as at least a part of, for example, a network device or a terminal device, especially may be implemented as at least a part of, for example, a transmitter or a transceiver included in a network device or a terminal device.

As shown in FIG. 17, the apparatus 1700 includes: a communicating means 1730 and a processing means 1750. The processing means 1750 includes a data processor (DP) 1710, a memory (MEM) 1720 coupled to the DP 1710. The communicating means 1730 is coupled to the DP 1710 in the processing means 1750. The MEM 1720 stores a program (PROG) 1740. The communicating means 1730 is for communications with other devices, which may be implemented as a transceiver for transmitting/receiving signals.

In some embodiments where the apparatus 1700 acts as a network device, the processing means 1750 may be configured to perform signal processing to an input signal and obtain an output signal, and the communicating means 1730 may be configured to transmit the output signal or receive an output signal transmitted by a terminal device. In some other embodiments where the apparatus 1700 acts as a terminal device, the processing means 1750 may be configured to perform signal processing to an input signal and obtain an output signal, and the communicating means 1730 may be configured to transmit the output signal or receive an output signal transmitted by a network device.

The PROG 1740 is assumed to include program instructions that, when executed by the associated DP 1710, enable the apparatus 1700 to operate in accordance with the embodiments of the present disclosure. The embodiments herein may be implemented by computer software executable by the DP 1710 of the apparatus 1700, or by hardware, or by a combination of software and hardware. A combination of the data processor 1710 and MEM 1720 may form processing means 1750 adapted to implement various embodiments of the present disclosure.

The MEM 1720 may be of any type suitable to the local technical environment and may be implemented using any suitable data storage technology, such as semiconductor based memory devices, magnetic memory devices and systems, optical memory devices and systems, fixed memory and removable memory, as non-limiting examples. While only one MEM is shown in the apparatus 1700, there may be several physically distinct memory modules in the apparatus 1700. The DP 1710 may be of any type suitable to the local technical environment, and may include one or more of general purpose computers, special purpose computers, microprocessors, digital signal processors (DSPs) and processors based on multicore processor architecture, as non-limiting examples. The apparatus 1700 may have multiple processors, such as an application specific integrated circuit chip that is slaved in time to a clock which synchronizes the main processor.

A device (such as a terminal device or a network device, not shown) is provided in an embodiment, the device includes the apparatus 1700, and the same contents as those in the first aspect and the second aspect of embodiments are omitted.

It will be appreciated that embodiments of the invention described herein may be comprised of one or more conventional processors and unique stored program instructions that control the one or more processors to implement, in conjunction with certain non-processor circuits, some, most, or all of the functions of generating a multicarrier communication signal having a reduced crest factor as described herein. The non-processor circuits may include, but are not limited to, a radio transmitter, signal drivers, clock circuits, power source circuits, and user input devices. As such, these functions may be interpreted as blocks of a method for generating a signal having a reduced crest factor. Alternatively, some or all functions could be implemented by a state machine that has no stored program instructions, or in one or more application specific integrated circuits (ASICs), in which each function or some combinations of certain of the functions are implemented as custom logic. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and integrated circuits (ICs) with minimal experimentation.

For example, one or more of the examples described herein may be implemented in a field programmable gate array (FPGA), typically includes an array of programmable tiles. These programmable tiles can include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or another computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

By way of example, embodiments of the present disclosure can be described in the general context of machine-executable instructions, such as those included in program modules, being executed in a device on a target real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

The above program code may be embodied on a machine readable medium, which may be any tangible medium that may contain, or store a program for use by or in connection with an instruction execution system, apparatus, or device. The machine readable medium may be a machine readable signal medium or a machine readable storage medium. The machine readable medium may include but not limited to an electronic, magnetic, optical, electromagnetic, infrared, or semiconductor system, apparatus, or device, or any suitable combination of the foregoing.

More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this disclosure, the device may be implemented in the general context of computer system-executable instructions, such as program modules, being executed by a computer system. Generally, program modules may include routines, programs, objects, components, logic, data structures, and so on that perform particular tasks or implement particular abstract data types. The device may be practiced in distributed cloud computing environments where tasks are performed by remote processing devices that are linked through a communications network. In a distributed cloud computing environment, program modules may be located in both local and remote computer system storage media including memory storage devices.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. A multistage Doherty power amplifier, comprising:
a generalized carrier amplifier, and
a generalized peaking amplifier, connected to the generalized carrier amplifier,
wherein the generalized carrier amplifier and the generalized peaking amplifier are arranged in a 2-way inverted Doherty power amplifier form; and
wherein one or more of:
the generalized carrier amplifier comprises a nested 2-way inverted Doherty sub amplifier; and
the generalized peaking amplifier comprises a nested single ended sub amplifier or a nested 2-way normal Doherty sub amplifier.

2. The multistage Doherty power amplifier according to claim 1, wherein, the generalized carrier amplifier comprises a sub carrier amplifier and a first sub peaking amplifier connected to the sub carrier amplifier.

3. The multistage Doherty power amplifier according to claim 2, wherein, the sub carrier amplifier is of a first semiconductor feature, the first sub peaking amplifier is of a second semiconductor feature with harmonic termination.

4. The multistage Doherty power amplifier according to claim 3, wherein, the power gain of the first sub peaking amplifier is greater than that of the sub carrier amplifier for power gain extension, the power gain of the sub carrier amplifier is compressed to a predetermined compression level, and the power gain of the first peaking amplifier is not compressed.

5. The multistage Doherty power amplifier according to claim 4, wherein, characteristic of the power gain extension is an inverse characteristic to a driver amplifier connected to the multistage Doherty power amplifier in line up or in cascade, so as to perform pre-distortion to the driver amplifier.

6. The multistage Doherty power amplifier according to claim 3, wherein, amplifier efficiency of the first sub peaking amplifier is higher than that of the sub carrier amplifier.

7. The multistage Doherty power amplifier according to claim 6, wherein the generalized peaking amplifier comprises a second sub peaking amplifier, the second sub peaking amplifier is of the first semiconductor feature.

8. The multistage Doherty power amplifier according to claim 7, wherein the bias voltage values of the sub carrier amplifier and the sub second peaking amplifier are positive, and the bias voltage value of the first sub peaking amplifier is negative.

9. The multistage Doherty power amplifier according to claim 7, wherein the power ratio among the sub carrier amplifier, the first sub peaking amplifier and the second sub peaking amplifier is determined according to power distribution function (PDF) of high peak to average power ratio (PAPR) signal applied.

10. The multistage Doherty power amplifier according to claim 7, wherein the first semiconductor feature is LDMOS, the second semiconductor feature is GaN HEMT.

11. The multistage Doherty power amplifier according to claim 6, wherein the generalized peaking amplifier comprises multiple sub peaking amplifiers, last stage sub peaking amplifier is of a first semiconductor feature, other-stage sub peaking amplifiers excluding the last stage sub peaking amplifier are of a second semiconductor feature, and amplifier efficiency of the other-stage sub peaking amplifiers excluding the last stage sub peaking amplifier is higher than that of the last stage sub peaking amplifier.

12. The multistage Doherty power amplifier according to claim 11, wherein the bias voltage values of the sub carrier amplifier and the last stage sub peaking amplifier are positive, and the bias voltage values of the first sub peaking amplifier and the other-stage sub peaking amplifiers excluding the last stage sub peaking amplifier are negative.

13. The multistage Doherty power amplifier according to claim 11, wherein the power ratio among the sub carrier amplifier, the first sub peaking amplifier, and the multiple sub peaking amplifiers is determined according to power distribution function (PDF) of high peak to average power ratio (PAPR) signal applied.

14. The multistage Doherty power amplifier according to claim 11, wherein the first semiconductor feature is LDMOS, the second semiconductor feature is GaN HEMT.

15. The multistage Doherty power amplifier according to claim 11, wherein, the power gains of other-stage sub peaking amplifiers excluding the last stage sub peaking amplifier are higher than that of the first sub peaking amplifier for power gain extension, the power gain of each stage sub peaking amplifier of the other-stage sub peaking amplifiers excluding the last stage sub peaking amplifier is higher than that of its prior stage for power gain extension, the power gain of the sub carrier amplifier is compressed to a predetermined compression level, and the power gains of the other-stage sub peaking amplifiers excluding the last stage sub peaking amplifier are not compressed.

16. The multistage Doherty power amplifier according to claim 15, wherein, characteristic of the power gain extension is an inverse characteristic to a driver amplifier connected to the multistage Doherty power amplifier in line up or in cascade, so as to perform pre-distortion to the driver amplifier.

17. The multistage Doherty power amplifier according to claim 11, wherein, the generalized peaking amplifier comprises 3 sub peaking amplifiers to form a 4-stage Doherty power amplifier.

18. A transmitter, comprising:
  a signal processor, configured to perform signal processing on base band input signals of multiple channels; and
  a multistage Doherty power amplifier comprising:
    a generalized carrier amplifier, which is a nested 2-way inverted Doherty sub amplifier; and
    a generalized peaking amplifier, connected to the generalized carrier amplifier, which is a nested single ended sub amplifier or a nested 2-way normal doherty sub amplifier;
  wherein the generalized carrier amplifier and the generalized peaking amplifier are arranged in a 2-way inverted Doherty power amplifier form.

19. A device, comprising:
a processor;
a memory, the memory containing instructions executable by the processor, and
the transmitter comprising:
  a signal processor, configured to perform signal processing on base band input signals of multiple channels; and
  a multistage Doherty power amplifier comprising:
    a generalized carrier amplifier; and
    a generalized peaking amplifier, connected to the generalized carrier amplifier;
  wherein the generalized carrier amplifier and the generalized peaking amplifier are arranged in a 2-way inverted Doherty power amplifier form; and
  wherein one or more of:
    the generalized carrier amplifier comprises a nested 2-way inverted Doherty sub amplifier; and
    the generalized peaking amplifier comprises a nested single ended sub amplifier or a nested 2-way normal Doherty sub amplifier.

20. The device according to claim 19, wherein the device is a terminal device or a network device.

* * * * *